United States Patent
Chen et al.

(10) Patent No.: US 8,928,024 B2
(45) Date of Patent: Jan. 6, 2015

(54) OPTICAL DEVICE AND METHOD FOR MANUFACTURING THE SAME

(71) Applicant: National Taiwan University, Taipei City (TW)

(72) Inventors: Hsuen-Li Chen, Taipei (TW); Cheng-Yi Fang, Taipei (TW); Yang-Chun Lee, Taipei (TW); Yu-Lun Liu, Taipei (TW); De-Hui Wan, Taipei (TW); Chen-Chieh Yu, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 14/048,123

(22) Filed: Oct. 8, 2013

(65) Prior Publication Data

US 2014/0306252 A1  Oct. 16, 2014

(30) Foreign Application Priority Data

Apr. 12, 2013  (TW) .............................. 102113037 U

(51) Int. Cl.
  *H01L 29/66*  (2006.01)
  *H01L 33/58*  (2010.01)

(52) U.S. Cl.
  CPC ...................................... *H01L 33/58* (2013.01)
  USPC ........................................................ 257/98

(58) Field of Classification Search
  CPC .......... H01L 33/22; H01L 33/24; H01L 33/26
  USPC ...................................................... 257/79, 98
  See application file for complete search history.

(56) References Cited

U.S. PATENT DOCUMENTS

2006/0278880 A1* 12/2006 Lee et al. ......................... 257/79
2009/0224660 A1*  9/2009 Nakanishi et al. ............ 313/504

OTHER PUBLICATIONS

Cheng-Yi Fang et al., "Nanoparticle Stacks with Graded Refractive Indices Enhance the Omnidirectional Light Harvesting of Solar Cells and the Light Extraction of Light-Emitting Diodes", Oct. 16, 2012, Advanced Functional Materials.

* cited by examiner

*Primary Examiner* — Brook Kebede
(74) *Attorney, Agent, or Firm* — Bacon & Thomas, PLLC

(57) ABSTRACT

The present invention provides an optical device, and the optical device comprises a luminous element and a gradient-index nanoparticle layer and scattering particles composed by particles stack with different refractive indexes and particle sizes. The luminous element has a light emitting surface. The refractive indexes of the nanoparticle layers decrease bottom up. The nanoparticles based gradient-index nanoparticle layer comprises a plurality of dielectric layers with different refractive index, and the dielectric scattering particle layers are stacked upward from the light emitting surface to let the gradient-index nanoparticle layer and scattering particles cover the light emitting surface. The method for manufacturing the abovementioned optical device is also disclosed.

10 Claims, 13 Drawing Sheets

OPTICAL DEVICE AND METHOD FOR MANUFACTURING THE SAME

BACKGROUND OF THE INVENTION

1. Field of the Invention

The present invention relates to an optical device, particularly to an optical device in which there is spin coated nanoparticle on its light emitting surface to increase its Light Extraction Efficiency and the manufacturing method thereof.

2. Description of the Prior Art

Current semiconductor luminous element, such as light emitting diode, has the advantages such as long life, small volume, high vibration resistance, low heat generation and low power consumption etc., which is already widely applied in cell phone display backlight module, vehicle lighting system, decoration lamp and remote control field as the indicator or light source. Moreover, because the luminous efficiency of light emitting diode has been raised constantly, the white light emitting diode has gradually substituted the conventional fluorescent lamp and incandescent bulb on applications such as the light source of scanner, backlight source of liquid crystal display or lighting equipment etc.

Please refer to FIG. 1A. FIG. 1A illustrates the cross-sectional diagram of prior-art top emission light emitting diode. As shown in the FIG. 1A, the luminous element 10 (i.e. light emitting diode 10) includes a substrate 11, a N-type semiconductor layer 12, a multiple quantum well layer 13, a P-type semiconductor layer 14 and two electrodes 15. Generally speaking, in order to conduct the P-type semiconductor layer 14 and the N-type semiconductor layer 12 to operate the light emitting device 10, one electrode 15 is formed on the P-type semiconductor layer 14, and another electrode 15 is formed on the N-type semiconductor layer 12. In addition, before forming another electrode 15, it is necessary to partially etch the P-type semiconductor layer 14, the multiple quantum well layer 13 and the N-type semiconductor layer 12 on the light emitting device 10. Then, another electrode 15 is formed on the exposed part of N-type semiconductor layer 12. After recombining the electron and hole injected by semiconductor layer, the light beam L is generated on the luminous area, and emitted from the transparent electrode on the P-type semiconductor layer or substrate (please refer to the flip chip LED shown in FIG. 1B). The common materials used for making LED include various III-V Group compounds, such as the aluminum gallium indium phosphide (AlGaInP), and the gallium nitride (GaN), wherein the gallium nitride LED is grown on the sapphire substrate.

Theoretically, the efficiency of LED is influenced by two factors, such as the Internal Quantum Efficiency (IQE) and the Light Extraction Efficiency (LEE). The IQE is determined by the property and quality of material. The LEE is the ratio of light emitted from device to the ambient air or encapsulated epoxy resin, which is an important factor for influencing the efficiency of LED. The behavior if light in LED is determined by the LEE mainly. Because the LED material is the high refractive index medium, when the light wants to penetrate LED, it will encounter the problem of total internal reflection, so that only about 8% of luminous energy can leave the surface of LED actually, which is the LEE. Thus, if the Light Extraction Efficiency (LEE) of LED can be raised, the whole luminous efficiency of LED can also be raised significantly.

At present, many methods have already been proposed for increasing the Light Extraction Efficiency (LEE) of LED. The most common method is to make a coarse structure or make other periodic structure to reduce the total internal reflection effect on light emitting surface of LED, in order to increase the Light Extraction Efficiency (LEE). However, these methods almost need complicated process of etching or lithography process, the former process will destroy the electrical property of LED to influence the efficiency of device, and the later process will increase the manufacturing cost greatly.

SUMMARY OF THE INVENTION

In view of the abovementioned description, the present invention provides an optical device, and the optical device comprises a luminous element and a gradient-index optical thin film composed by nanoparticles stacks. The luminous element has a light emitting surface. The nanoparticles based gradient-index structure comprises a plurality of dielectric nanoparticle layers with different refractive index, and the dielectric nanoparticle layers are stacked upward from the light emitting surface to let the gradient-index nanoparticle layer cover the light emitting surface. It is noted that the refractive indexes of the dielectric nanoparticle layers decrease bottom up.

In an embodiment of the present invention, wherein the luminous element is a light emitting diode, and this light emitting diode is a top emission LED or a flip chip LED.

In an embodiment of the present invention, wherein the refractive index lies between that of light emitting surface and air, and the refractive index for the dielectric material layer adjacent to the light emitting surface is closed to that of light emitting surface.

In an embodiment of the present invention, the dielectric material layer is composed of a plurality of nanoparticles, and the diameter of a plurality of nanoparticle is smaller than the wavelengths of emitting light of LED.

In an embodiment of the present invention, wherein the diameter of nanoparticle lies between 10 nm and 100 nm, and the nanoparticle can be freely selected from the group consisting of titanium dioxide nanoparticle, zirconium dioxide nanoparticle, indium tin oxide nanoparticle, zinc oxide nanoparticle, dysprosium oxide nanoparticle, yttrium oxide nanoparticle, tantalum pentoxide nanoparticle, aluminum oxide nanoparticle and silicon dioxide nanoparticle.

In an embodiment of the present invention, wherein the optical device provided by the present invention further comprises a plurality of scattering particles, and the scattering particles is disposed on the gradient-index layer.

In an embodiment of the present invention, wherein the diameter of scattering particle is closed to a wavelength of emitting light, and the particle diameter lies between 200 nm and 2 μm.

In an embodiment of the present invention, wherein the material of scattering particle can be the titanium dioxide, zirconium dioxide, indium tin oxide, zinc oxide, dysprosium oxide, yttrium oxide, tantalum pentoxide, aluminum oxide, or silicon dioxide nanoparticle.

In an embodiment of the present invention, wherein the manufacturing method of optical device comprises the following steps: Firstly, providing a luminous element with the light emitting surface. Secondly, spin coating one of a plurality of dielectric material layers on the light emitting surface, then spin coating another one of a plurality of dielectric material layers on one of dielectric material layers.

In an embodiment of the present invention, wherein the manufacturing method further comprises the following step: Spin coating the scattering particles on one of dielectric material layers.

In the present invention, the gradient-index nanoparticle layer and scattering particles composed by particles stack with different refractive indexes and particle sizes.

Therefore, the advantage and spirit of the present invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Regarding the abovementioned description, in order to increase the LEE of light emitting device and improve the bottleneck of prior art, the present invention adopts simple spin coating method to dispose a plurality of dielectric layers on the light emitting surface of LED, therefore, to develop low-cost and compatible Light Extraction Efficiency (LEE) structure on current LED. The present invention not only can raise the Light Extraction Efficiency (LEE), but also will not damage the structure of device.

Figure 1A:
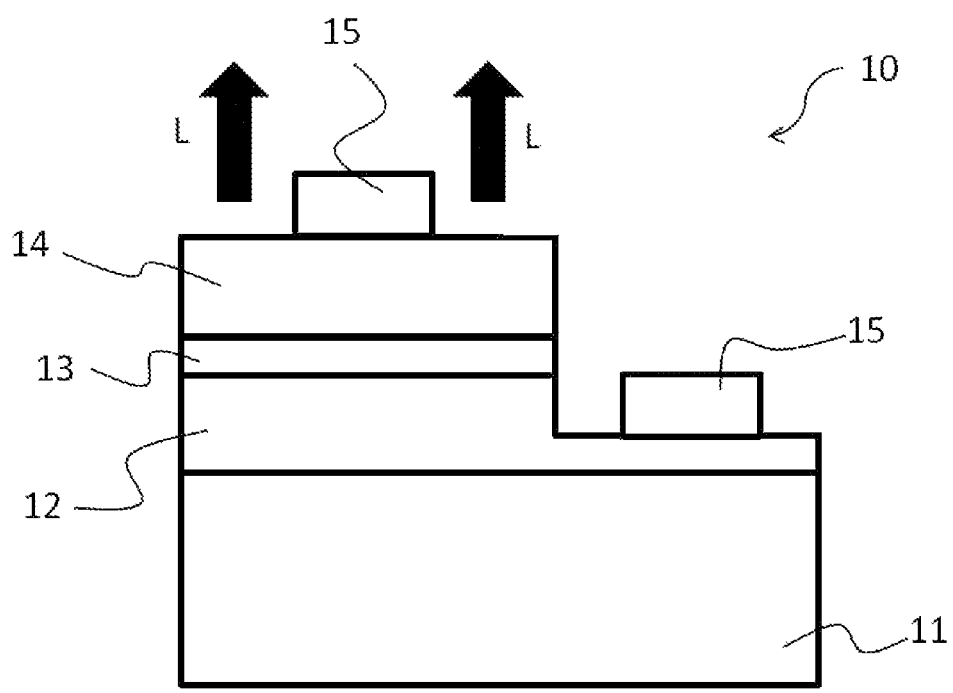
FIG. 1A illustrates the cross-sectional diagram of prior-art top emission light emitting diode.
Figure 1B:
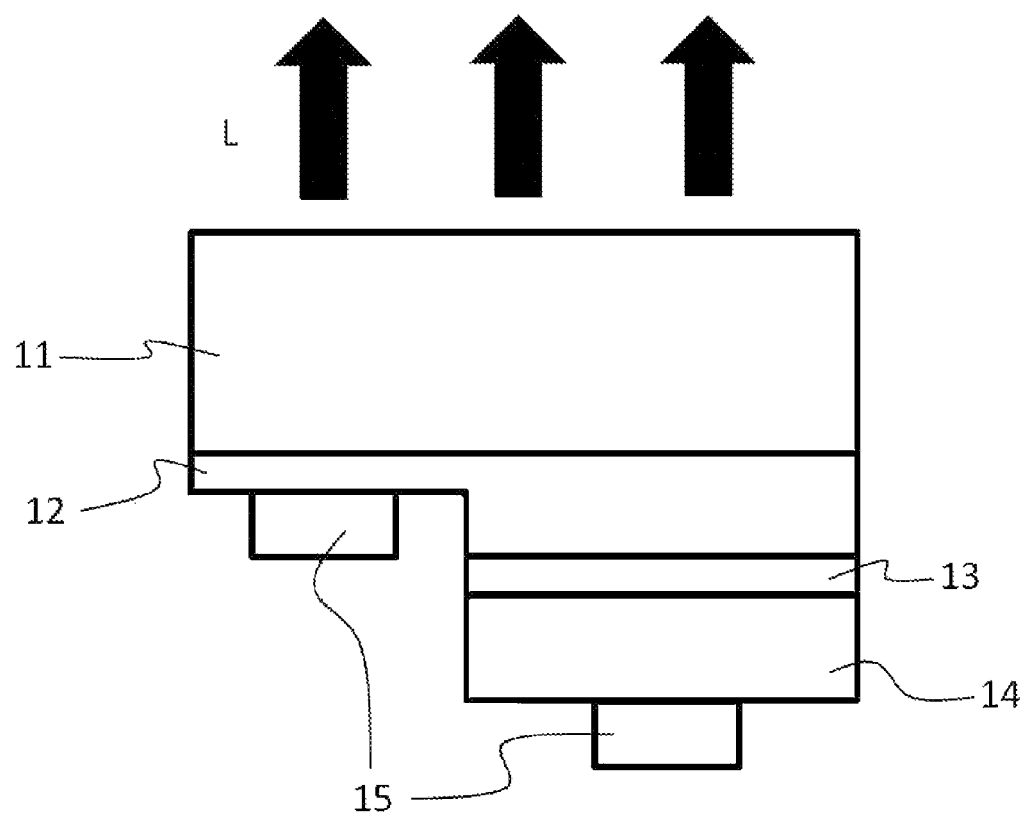
FIG. 1B illustrates the cross-sectional diagram of prior-art flip chip light emitting diode.
Figure 2A:
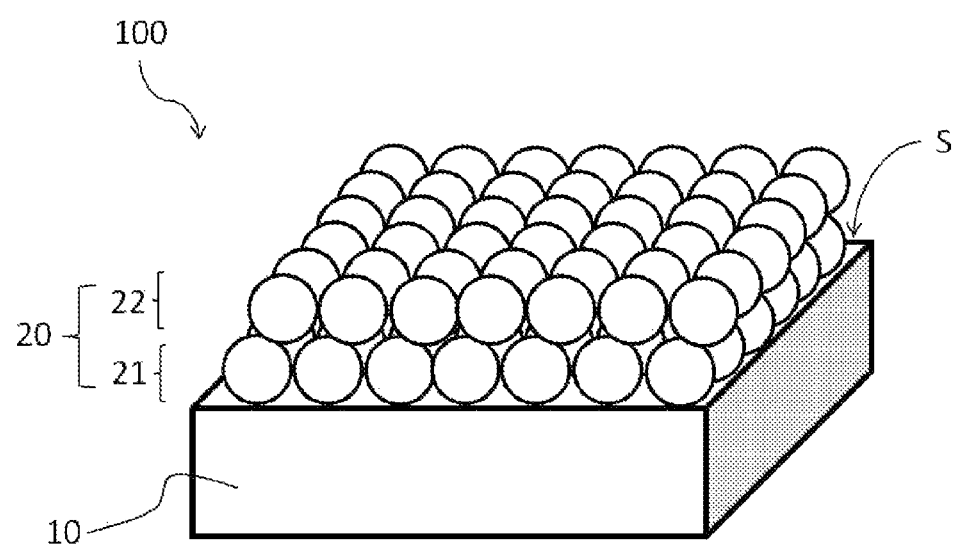
FIG. 2A and FIG. 2B illustrate the structure diagram for the optical device of an embodiment according to the present invention.

Firstly, please refer to FIG. 2A. FIG. 2A illustrates the structure diagram for the optical device 100 of an embodiment according to the present invention. As shown in the FIG. 2A, the optical device 100 comprises a luminous element 10 and a gradient-index nanoparticle layer 20. The luminous element 10 has a light emitting surface S. In the present invention, the luminous element 10 adopts a light emitting device as a preferred embodiment for follow-up description. However, the optical device of present invention can also be applied to other organic light emitting device, thin-film solar cell or organic solar cell etc. In addition, the light emitting device may be the top emission light emitting device (as shown in FIG. 1A) or the flip chip light emitting device (as shown in FIG. 1B). That is, when the optical device 10 is the top emission light emitting device, the light emitting surface S is the transparent electrode 15 on the P-type semiconductor layer, and the preferred one is an indium tin oxide (ITO) electrode. On the contrary, when the optical device 10 is the flip chip light emitting device, the light emitting surface S is the substrate 11, and the preferred one is a sapphire substrate. But, it has to say, the present invention is not limited for any one of the abovementioned embodiments.

As for the gradient-index nanoparticle layer 20, the light emitting surface S covered on the optical device 10, also comprises a plurality of dielectric material layer with different refractive index, and the dielectric material layers are stacked upward from the light emitting surface S in accordance with decreased refractive index. In an embodiment, the gradient-index nanoparticle layer 20 comprises a first dielectric material layer 21 and a second dielectric material layer 22. Wherein, the first dielectric material layer 21 has a first refractive index, the second dielectric material layer 22 has a second refractive index, and the second refractive index is smaller than the first refractive index. Thus, as shown in FIG. 2A, the first dielectric material layer 21 covers the light emitting surface S on the optical device 10, the second dielectric material layer 22 stacks on the first dielectric material layer 21, so that the refractive indexes of the gradient-index nanoparticle layer 20 decrease bottom up from the light emitting surface S.

In this embodiment, the first dielectric material layer 21 and the second dielectric material layer 22 respectively have a first refractive index and a second refractive index lain between that of light emitting surface S and air (or surrounded encapsulation material). When the light emitting surface S is the indium tin oxide (2.0 in refractive index), the present invention will select a plurality of dielectric material layers with refractive index lain between that of indium tin oxide and air as the gradient-index nanoparticle layer 20, and stacked upward in accordance with decreased refractive index. In addition, the refractive index of the dielectric material layer adjacent to the light emitting surface S (in this embodiment, it is the first dielectric material layer 21) is most closed to the refractive index of the light emitting surface S.

Preferably, the first dielectric material layer 21 and the second dielectric material layer 22 comprise a plurality of nanoparticles. The nanoparticle can be freely selected from the group consisting of titanium dioxide nanoparticle ($TiO_2$, refractive index in 2.45 to 2.80), zirconium dioxide nanoparticle ($ZrO_2$, refractive index in 2.17 to 2.35), indium tin oxide nanoparticle (ITO, refractive index in 1.85 to 2.30), zinc oxide nanoparticle (ZnO, refractive index in 1.90 to 2.10), dysprosium oxide nanoparticle ($Dy_2O_3$, refractive index in 1.97 to 2.02), yttrium oxide nanoparticle ($Y_2O_3$, refractive index in 1.90 to 2.01), tantalum pentoxide nanoparticle ($Ta_2O_5$, refractive index in 1.78 to 1.98), aluminum oxide nanoparticle ($Al_2O_3$, refractive index in 1.72 to 1.79) and silicon dioxide nanoparticle ($SiO_2$, refractive index in 1.50 to 1.56).

Moreover, the nanoparticle diameter is further smaller than a wavelength of emitting light, and preferably lies between 10 nm and 100 nm. Because the nanoparticle diameter is further smaller than a wavelength of emitting light, the gradient-index nanoparticle layer 20 with these nanoparticles can be considered as the flat optical film.

Figure 2B:
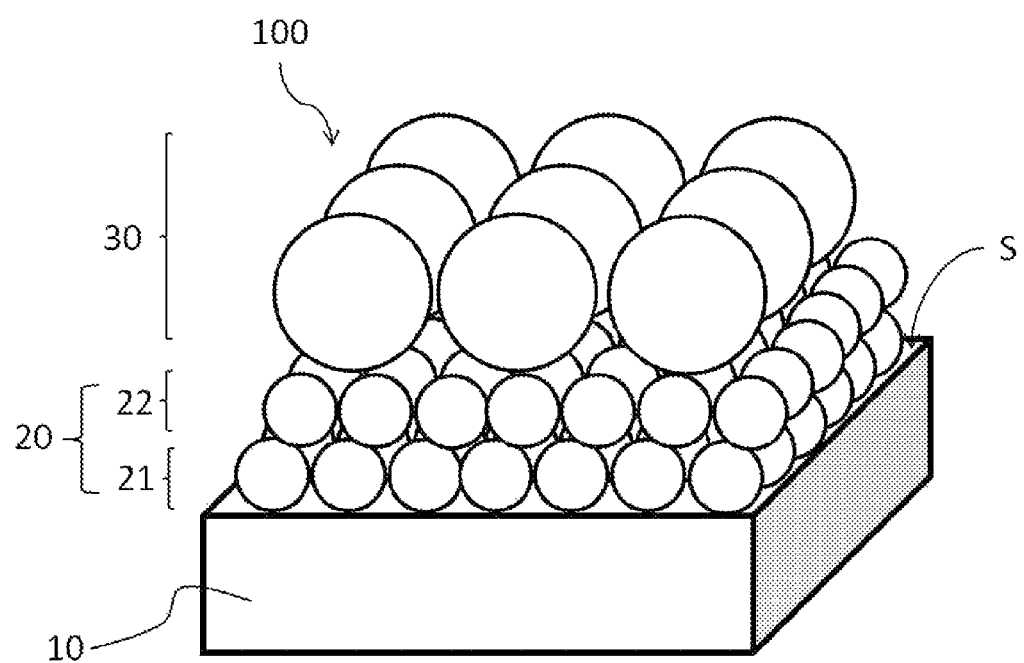

Basically, the gradient-index nanoparticle layer 20 covered on the light emitting surface S of the optical device 10 has anti-reflection effect, which can reduce the reflection the light emitting surface S effectively. However, if the coarseness of surface is very small, some of the light with incident angle larger than critical angle will still be reflected. Thus, please refer to FIG. 2B, in the optical device provided by the present invention, a plurality of scattering particles 30 are disposed on the gradient-index nanoparticle layer 20 to obtain much coarser surface.

Figure 2C:
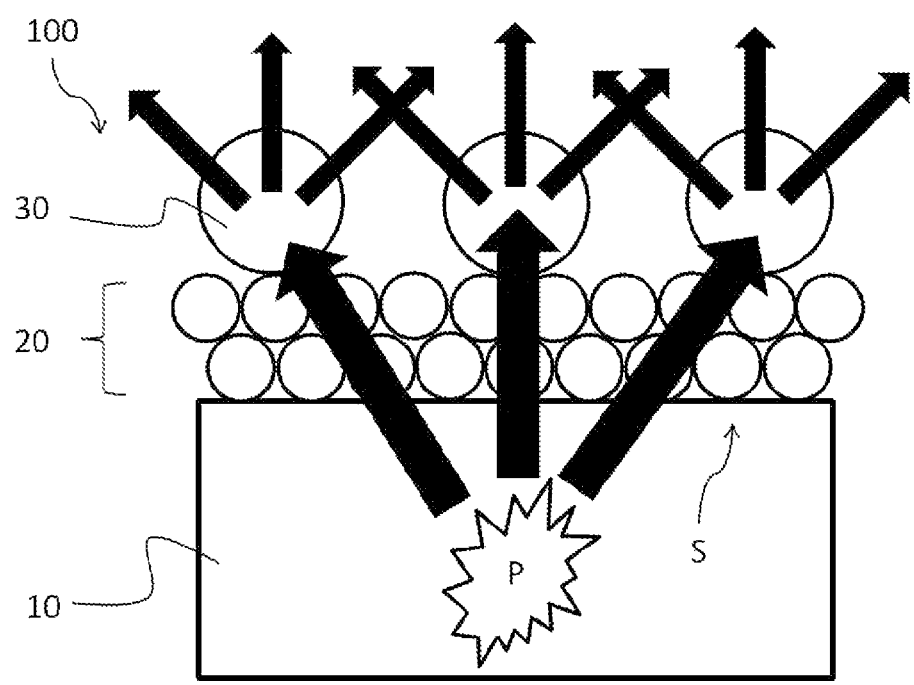
FIG. 2C illustrates the route of emitting light for the optical device of an embodiment according to the present invention.

Preferably, the diameter of scattering particle 30 is closed to a wavelength of emitting light, and the particle diameter preferably lies between 200 nm and 2 µm. In addition, the refractive index of scattering particle selected by the present invention must close to that of upmost top dielectric material layer (in this embodiment, it is the second dielectric material layer 22) of the gradient-index nanoparticle layer 20, which can be the titanium dioxide, zirconium dioxide, indium tin oxide, zinc oxide, dysprosium oxide, yttrium oxide, tantalum pentoxide, aluminum oxide, or silicon dioxide, but the present invention is not limited by this. As shown in FIG. 2C, the abovementioned scattering particles can change the incident angle of emitting light from the light source P, so that the light with incident angle larger than critical angle can leave the light emitting surface, in order to increase the LEE greatly.

Figure 2D:
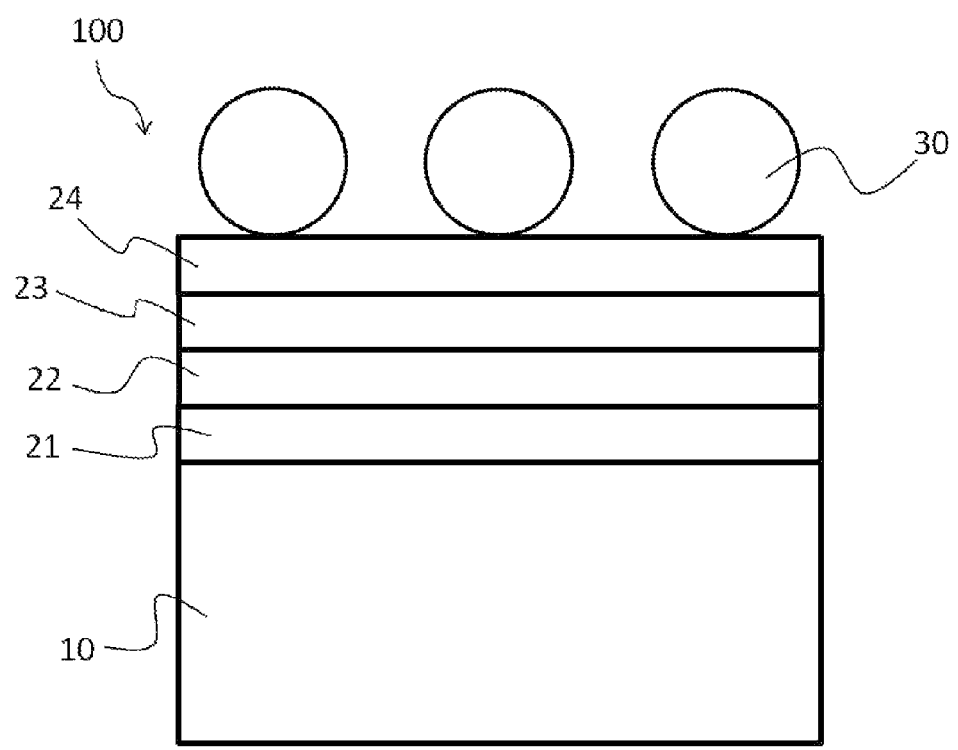
FIG. 2D illustrates the cross-sectional diagram of optical device according to another embodiment of the present invention.

In addition, please refer to FIG. 2D. FIG. 2D illustrates the cross-sectional diagram of optical device according to another embodiment of the present invention. In principle, the gradient-index nanoparticle layer 20 comprised at least two dielectric material layers can achieve the anti-reflection effect. However, in this embodiment, the gradient-index nanoparticle layer 20 may comprises more than two dielectric material layers, except a first dielectric material layer 21, a second dielectric material layer 22, it may further comprises the third dielectric material layer 23 and a fourth dielectric material layer 24. Moreover, as for the refractive indexes of the abovementioned four dielectric material layers, the refractive index of the fourth dielectric material layer<the third dielectric material layer<the second dielectric material layer<the first dielectric material layer. Basically, if the gradient-index nanoparticle layer 20 comprises more dielectric material layers, the effect will be raised.

Meantime, the manufacturing method for the abovementioned optical device is described as follows. Firstly, provide a luminous element with the abovementioned light emitting surface. It is noted that when the light emitting device is used as a preferred embodiment for the optical device 10, the scheme has been described in the previous test, which will not be described again.

Secondly, preparing several solutions suspended with the dielectric nanoparticles with different kind and diameter. The abovementioned suspended solution can be selected from the zirconium dioxide suspended solution (diluted to 2 wt % by isopropanol and water), yttrium oxide suspended solution (diluted to 4 wt % by isopropanol), aluminum oxide suspended solution (diluted to 2 wt % by ethanol) and silicon dioxide suspended solution (diluted to 3 wt % by isopropanol and water). Select at least two of these in accordance the abovementioned consideration of refractive index, and then spin coating them on the light emitting surface of the optical device is carried out, in order to form the abovementioned gradient-index nanoparticle layer.

Finally, the silicon dioxide suspended solution (diluted to 4 wt % by isopropanol and water) with larger diameter (such as 460 nm) is used to make the scattering particles by spin coating them on the gradient-index nanoparticle layer.

Figure 3:
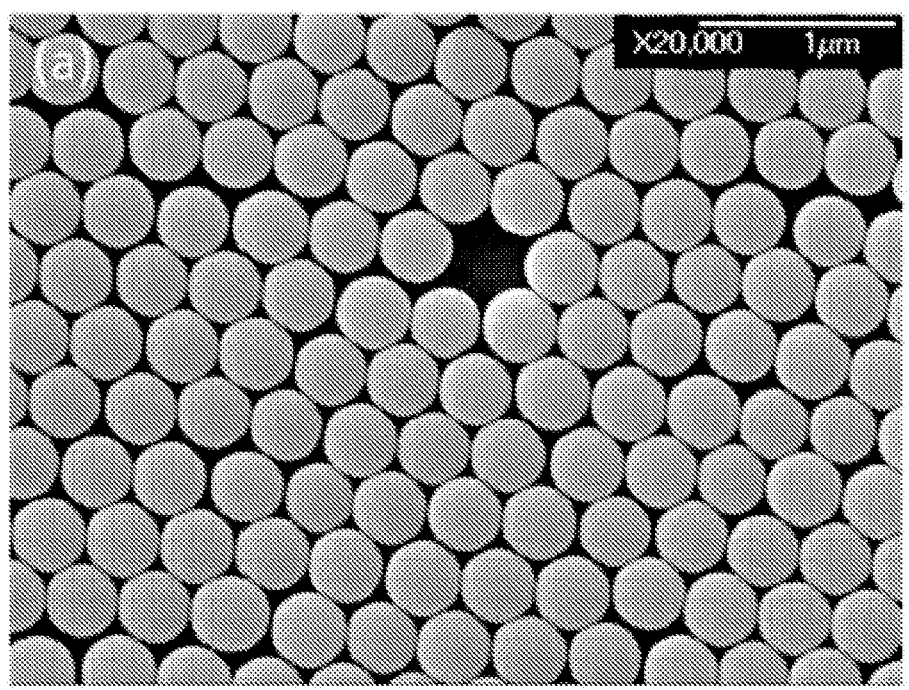
FIG. 3 illustrates the scanning electron microscope image of the light emitting device spin coated with the scattering particles.

FIG. 3 illustrates the scanning electron microscope image of the light emitting device spin coated with the scattering particles. As shown in the FIG. 3, the silicon dioxide scattering particles with 460 nm in size can be distributed on the whole surface evenly, so that there is uniform coarseness on light emitting device.

Accordingly, the structure and manufacturing method for the optical device provided by the present invention has been described in detail in the abovementioned text. The light emitting device, the light emitting device covered with the gradient-index nanoparticle layer, and the light emitting device covered with the gradient-index nanoparticle layer and the scattering particles will be analyzed in the following text.

Figure 4A:
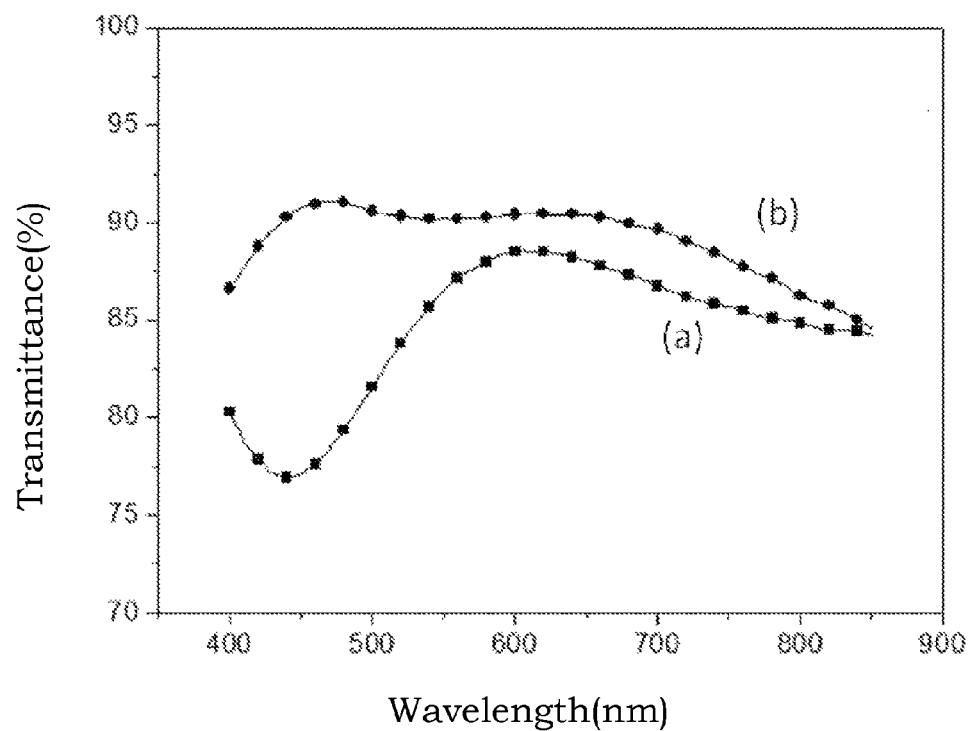
FIG. 4A illustrates the transmission spectrum of the optical device with the light emitting surface spin coated with the gradient-index nanoparticle layer according to an embodiment of the present invention.
Figure 4B:
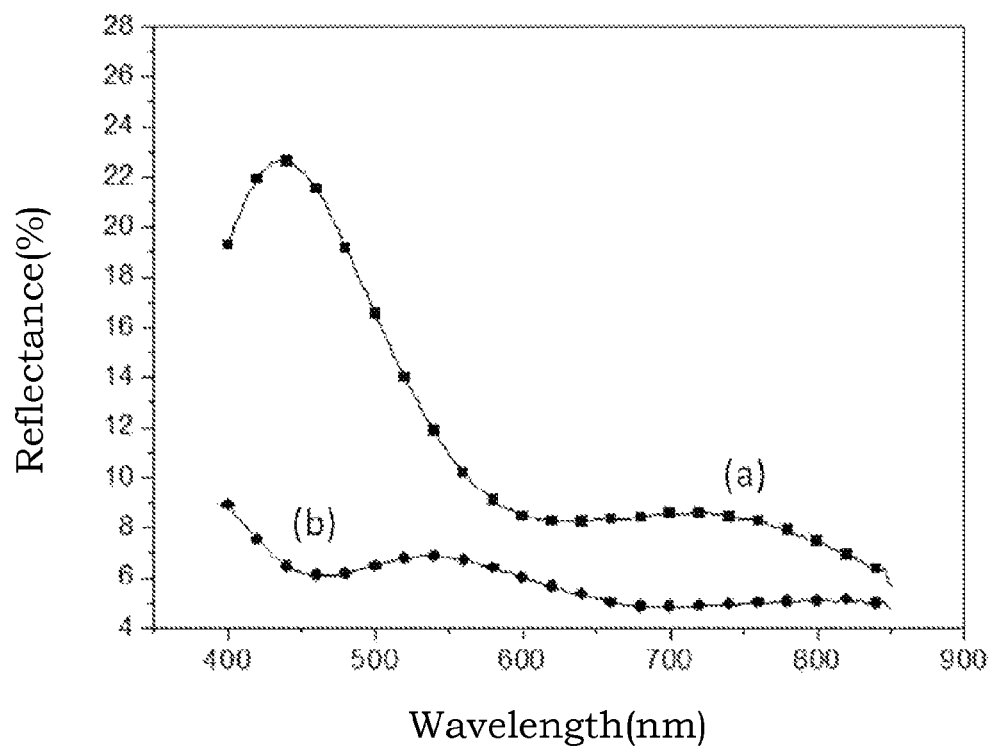
FIG. 4B illustrates the reflection spectrum of the optical device with the light emitting surface spin coated with the gradient-index nanoparticle layer according to an embodiment of the present invention.

Firstly, please refer to FIG. 4A and FIG. 4B. FIG. 4A illustrates the transmission spectrum of the optical device with the light emitting surface spin coated with the gradient-index nanoparticle layer according to an embodiment of the present invention: (a) before and (b) after. FIG. 4B illustrates the reflection spectrum of the optical device with the light emitting surface spin coated with the gradient-index nanoparticle layer according to an embodiment of the present invention: (a) before and (b) after. As described in the abovementioned text, an embodiment of the present invention adopts the top emission light emitting device shown in FIG. 1A, wherein the light emitting surface is the transparent ITO layer. Moreover, because the refractive index of ITO is ca. 2 at 460 nm of wavelength, the material stacked upward on the light emitting surface will be the yttrium oxide, aluminum oxide and silicon dioxide.

Then, regarding the interface reflection of ITO and air, the present invention adopts the ITO glass for spectrum analysis first. It is known from FIG. 4A, when the ITO glass is covered by the gradient-index nanoparticle layer, the transmittance can be raised greatly at visible light region and infrared region, which reveals that the gradient-index nanoparticle layer can be considered as an anti-reflection layer. Moreover, the gradient-index nanoparticle layer is spin coated on the ITO glass, thus the transmittance of light can be increased without destroying the structure and electrical property of the ITO glass.

It is known from FIG. 4B, the reflectance of ITO glass is about 20% at 460 nm. Even the incident angle does not exceed the critical angle; about 20% of emitted light from the device will be reflected back into the device. However, when the gradient-index nanoparticle layer is applied by the present invention, the gradient-index nanoparticle layer can effectively reduce the reflectance at blue light zone, in order to increase the LEE of light emitting device.

Figure 5A:
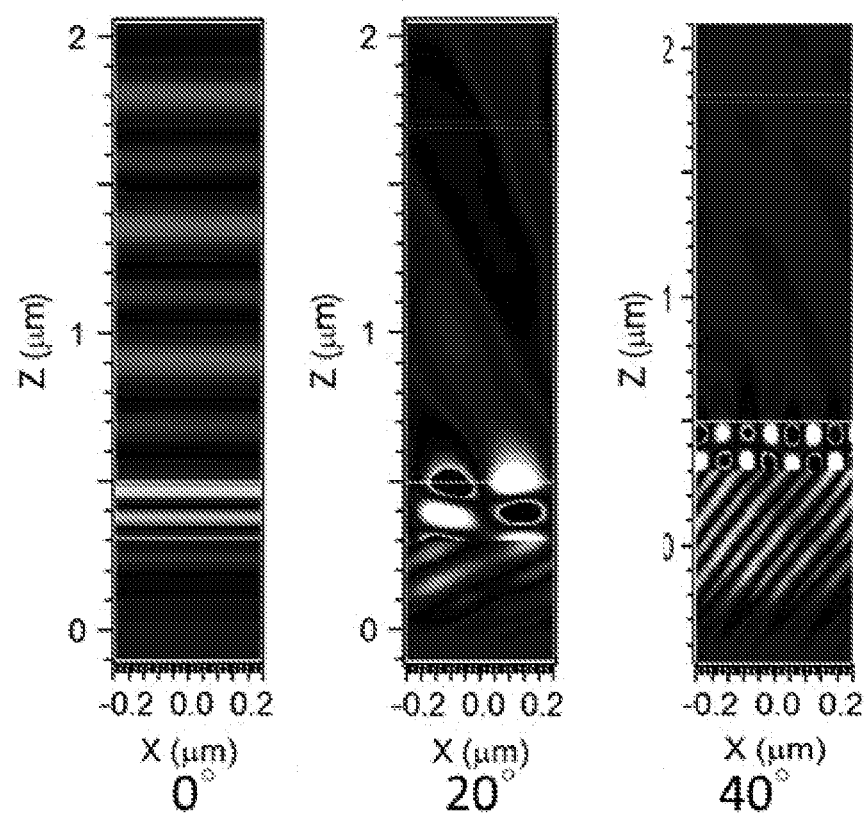
FIG. 5A illustrates the light extraction electric field distribution diagram of prior-art light emitting device at 460 nm of simulated wavelength.
Figure 5B:
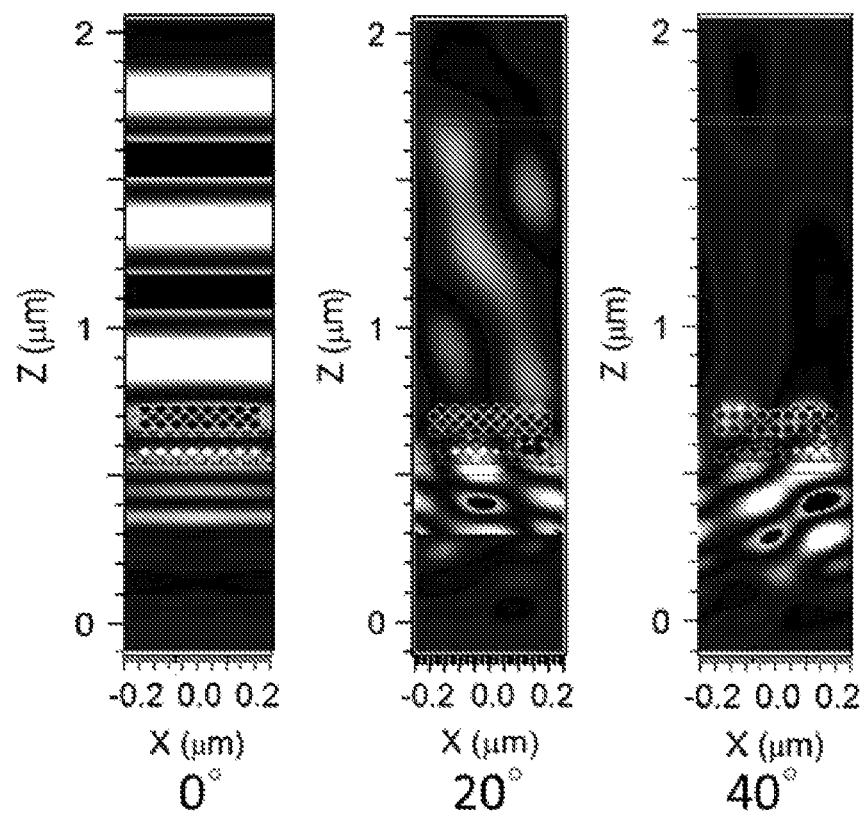
FIG. 5B illustrates the light extraction electric field distribution diagram of the light emitting device spin coated with the gradient-index nanoparticle layer at 460 nm of simulated wavelength.
Figure 5C:
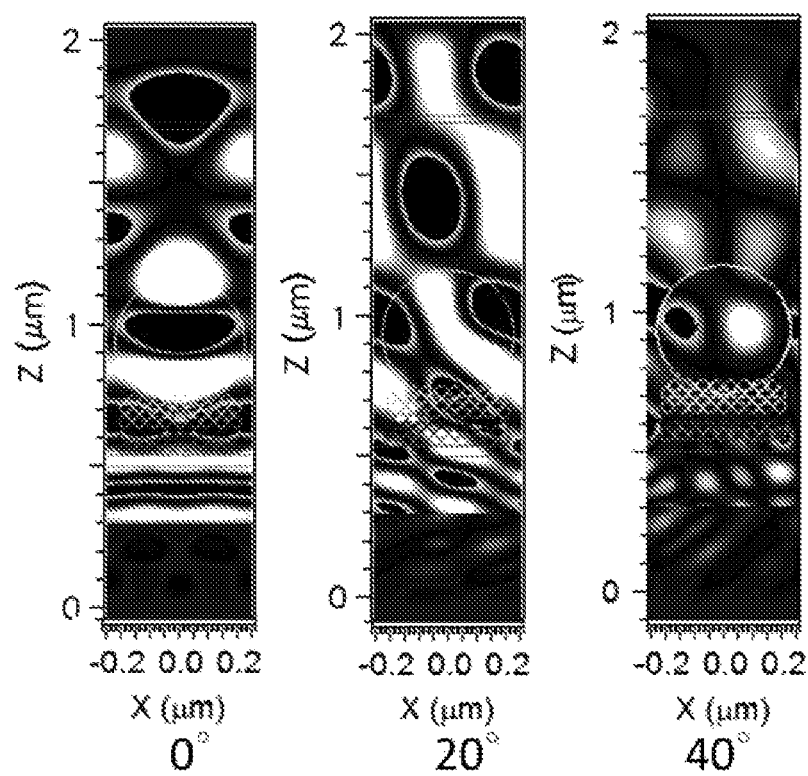
FIG. 5C illustrates the light extraction electric field distribution diagram of the light emitting device spin coated with both the gradient-index nanoparticle layer and the scattering particles at 460 nm of simulated wavelength.

Please refer to FIG. 5A, FIG. 5B and FIG. 5C further. FIG. 5A illustrates the light extraction electric field distribution diagram of known light emitting device, the light emitting device spin coated with the gradient-index nanoparticle layer, and the light emitting device spin coated with the gradient-index nanoparticle layer and the scattering particles at 460 nm of simulated wavelength. It is known from FIG. 5A and FIG. 5B, when the light normally incident the light emitting surface, the gradient-index nanoparticle layer will reduce the reflection and increase the transmission of surface. However, when the incident angle is increased to 40°, because the incident angles exceed the critical angle, the gradient-index nanoparticle layer will be unable to reduce the effect of total internal reflection effectively. At this time, the present invention adds the silicon dioxide particles (in this embodiment, the particle diameter is 460 nm) on the gradient-index nanoparticle layer as scattering structure, which not only can reduce the interface reflection within critical angle, but also can reduce total internal reflection effect significantly, as shown in FIG. 5C.

Figure 6:
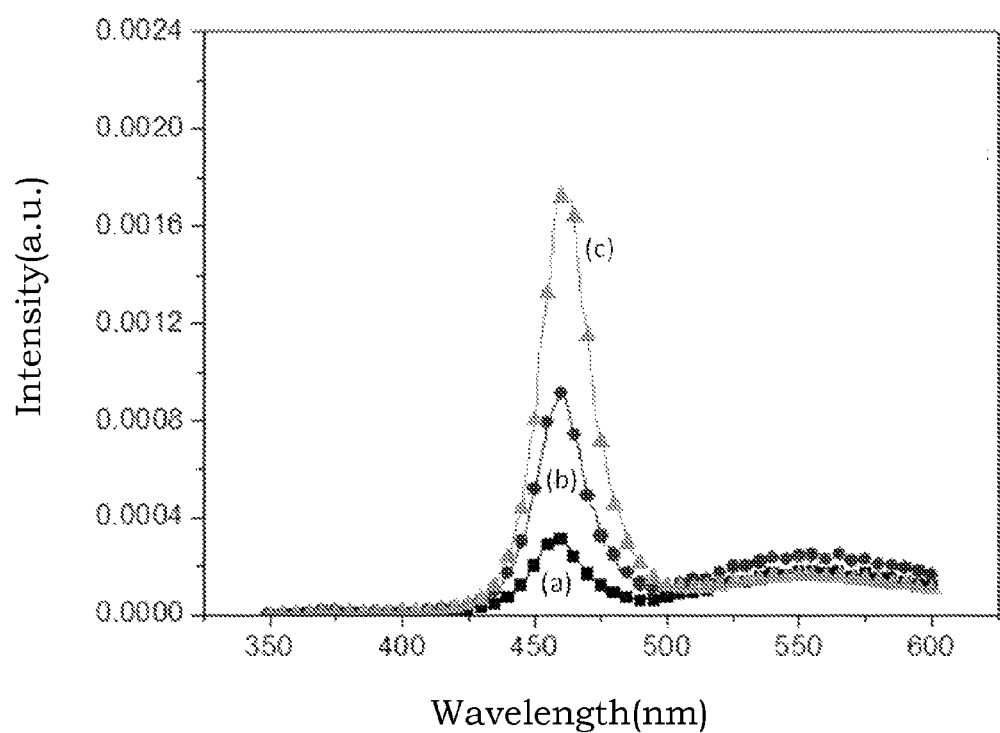
FIG. 6 illustrates the photoluminescence spectrum of prior-art light emitting device, the light emitting device spin coated with the gradient-index nanoparticle layer, and the light emitting device spin coated with both the gradient-index nanoparticle layer and scattering particles.

In order to prove that this structure has good Light Extraction Efficiency (LEE), the photoluminescence spectrum is measured. Please refer to FIG. 6. FIG. 6 illustrates the photoluminescence spectrum of known light emitting device (a), the light emitting device spin coated with the gradient-index nanoparticle layer (b), and the light emitting device spin coated with both the gradient-index nanoparticle layer and scattering particles (c). The laser used in the present invention is the helium-cadmium laser with 325 nm of wavelength. The curve (a) represents the photoluminescence spectrum of the control group, in which no particle is spin coated on light emitting device. The curve (b) represents the photoluminescence spectrum of the light emitting device spin coated with the gradient-index nanoparticle layer without scattering particles. The curve (c) represents the PL spectrum of complete light emitting device with both the gradient-index nanoparticle layer and scattering particles. As shown in the FIG. 6, because the structure with the gradient-index nanoparticle layer only is unable to effectively reduce the effect of total internal reflection, the increased Light Extraction Efficiency (LEE) is limited. The structure with both the gradient-index nanoparticle layer and scattering particles is able to significantly reduce the effect of total internal reflection; the increased Light Extraction Efficiency (LEE) is very large. It proves that this structure is able to increase the Light Extraction Efficiency (LEE) of light emitting device. In addition, because the spin coating will not influence the electrical property of light emitting device, thus the increase of Light Extraction Efficiency (LEE) will be reflected on the working device actually.

In summary, the method adopted by the present invention is to use the spin coating to dispose the gradient-index nanoparticle layer and scattering particles on the light emitting surface of light emitting device. Because the nanoparticle diameter lies between 10 and 100 nm, the gradient-index nanoparticle layer with these nanoparticles can be considered as the flat optical thin film. In addition, the 200 nm to 2 μm nanoparticles can be disposed on the gradient-index nanoparticle layer to increase the coarseness of surface, and reduce the interface reflection and total internal reflection of the light emitting surface, in order to raise the LEE of light emitting diode greatly. In addition, this method does not need complicated processes of etching or photolithography procedures and only need spin coating, which will not affect the electrical property of LED and has the potential to be used in current light emitting device process. Especially, in the present invention, the gradient-index nanoparticle layer and scattering particles composed by particles stack with different refractive indexes and particle sizes.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertain.

What is claimed is:

1. An optical device, comprising:
   a luminous element, the luminous element having a light emitting surface; and
   a gradient-index nanoparticle layer, having a plurality of dielectric layers with different refractive index of nanoparticles;
   wherein the plurality of dielectric layers being stacked upward from the light emitting surface to let the gradient-index nanoparticle layer cover the light emitting surface, wherein the different refractive indexes of the dielectric layers decreasing bottom up.

2. The optical device according to claim 1, wherein the luminous element is a light emitting diode, and the light emitting diode is selected from the group consisting of a top emission LED and a flip chip LED.

3. The optical device according to claim 1, wherein the refractive index lies between that of a light emitting surface and an air, and the refractive index for the dielectric particle layer adjacent to the light emitting surface is closed to that of light emitting surface.

4. The optical device according to claim 1, wherein the dielectric material layer is composed of a plurality of nanoparticles and the particle diameter is further smaller than a wavelength of emitting light.

5. The optical device according to claim 4, wherein the diameter of nanoparticle lies between 10 nm and 100 nm, and the nanoparticle is freely selected from the group consisting of titanium dioxide nanoparticle, zirconium dioxide nanoparticle, indium tin oxide nanoparticle, zinc oxide nanoparticle, dysprosium oxide nanoparticle, yttrium oxide nanoparticle, tantalum pentoxide, aluminum oxide nanoparticle and silicon dioxide nanoparticle.

6. The optical device according to claim 1, wherein the optical device further comprises a plurality of scattering particles disposed on the gradient-index nanoparticle layer.

7. The optical device according to claim 6, wherein the diameter of scattering particle is closed to a wavelength of emitting light, and the particle diameter lies between 200 nm and 2 μm.

8. The optical device according to claim 6, wherein the material of scattering particle is selected from the group consisting of the titanium dioxide, zirconium dioxide, indium tin oxide, zinc oxide, dysprosium oxide, yttrium oxide, tantalum pentoxide, aluminum oxide and silicon dioxide.

9. The optical device according to claim 1, made by a method, comprising:
   providing a luminous element having the light emitting surface;
   spin coating one of a plurality of dielectric material layers on the light emitting surface; and
   spin coating another one of the plurality of dielectric material layers on one of the plurality of dielectric material layers.

10. The optical device according to claim 9, wherein the manufacturing method further comprising:
    spin coating the scattering particles on the other of the plurality of dielectric material layers.

* * * * *